(12) United States Patent
Nölscher et al.

(10) Patent No.: US 7,286,207 B2
(45) Date of Patent: Oct. 23, 2007

(54) EXPOSING A SEMICONDUCTOR WAFER USING TWO DIFFERENT SPECTRAL WAVELENGTHS AND ADJUSTING FOR CHROMATIC ABERRATION

(75) Inventors: Christoph Nölscher, Nürnberg (DE); Andreas Jahnke, Radebeul (DE)

(73) Assignee: Infineon Technologies, AG, Neubiberg (DE)

( * ) Notice: Subject to any disclaimer, the term of this patent is extended or adjusted under 35 U.S.C. 154(b) by 78 days.

(21) Appl. No.: 11/116,439

(22) Filed: Apr. 28, 2005

(65) Prior Publication Data
US 2006/0244937 A1    Nov. 2, 2006

(51) Int. Cl.
G03B 27/68    (2006.01)
(52) U.S. Cl. .......................... 355/55; 355/52
(58) Field of Classification Search ............... 355/55, 355/52, 53, 67, 69; 430/311
See application file for complete search history.

(56) References Cited

U.S. PATENT DOCUMENTS

| | | | |
|---|---|---|---|
| 6,831,731 B2 | 12/2004 | Omura et al. | |
| 2002/0048288 A1* | 4/2002 | Kroyan et al. | 372/20 |
| 2002/0163733 A1 | 11/2002 | Takahashi | |
| 2004/0059444 A1 | 3/2004 | Tsukakoshi | |
| 2005/0128452 A1* | 6/2005 | Matsumoto | 355/55 |

OTHER PUBLICATIONS

Fukuda H. et al., "Improvement of defocus tolerance in a half-micron optical lithograph by the focus latitude enhancement exposure method: simulation and experiment", J. Vac Sci. Technol. B7 (4) Jul./Aug. 1989, pp. 667-674.

Lalovic I, et al., "Depth of focus enhancement by wavelength modulation: can we RELAX and improve focus latitude?" Interface 2003, Proceedings 40th Interface Symposium Conference—San Diego, Sep. 21-23, 2003.

Slonaker S., "TAO: Technology for Aberration Optimization", Proceedings of SPIE, vol. 5754-190, 2005 (to be publixhed)//Litho Vision conference 2004-Feb. 22, 2004.

* cited by examiner

Primary Examiner—Henry Hung Nguyen
Assistant Examiner—Chia-how Michael Liu
(74) Attorney, Agent, or Firm—Edell, Shapiro & Finnan LLC

(57) ABSTRACT

A semiconductor wafer is exposed with a pattern from a mask or reticle in an exposure tool. The exposure tool has an adjustable lens system and a light source, which is tunable in wavelength. A first exposure is performed with a tuned first wavelength and a first setting of the lenses. Prior to performing a second exposure onto the same wafer and into the same resist layer, the wavelength of the light source is varied to a second wavelength in order to mimic a focus offset. A resulting image shift at the slit edges of the scanning system due to chromatic aberration is then corrected for by setting the lens system in dependence of the difference between the tuned first and second wavelength. Having tuned second wavelength of the light source and having set the lens system, the second exposure is performed. A continuous adjustment of the lens system based upon a continuously varying light source wavelength can be accomplished.

20 Claims, 2 Drawing Sheets

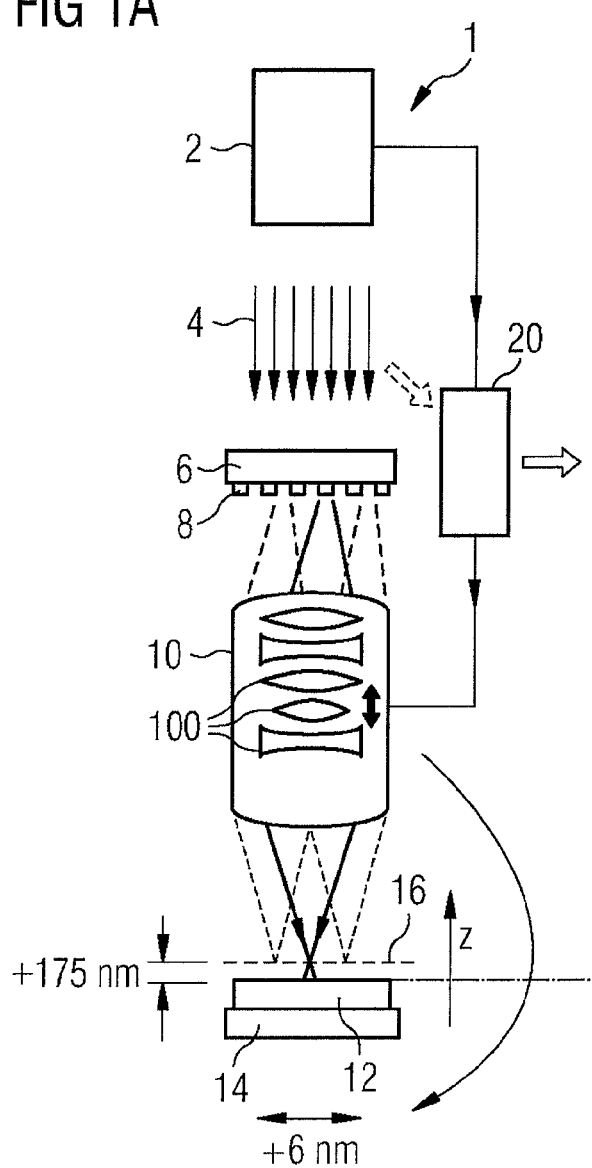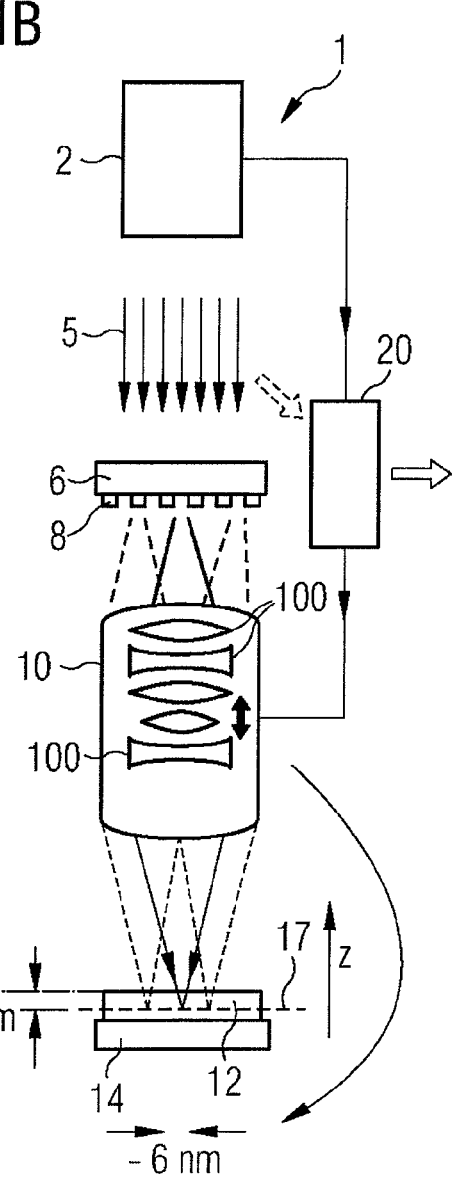

193,36754 nm 193,36846 nm

EXPOSING A SEMICONDUCTOR WAFER USING TWO DIFFERENT SPECTRAL WAVELENGTHS AND ADJUSTING FOR CHROMATIC ABERRATION

FIELD OF THE INVENTION

The invention relates to a method for exposing a semiconductor wafer with a pattern from a mask, or reticle, in an exposure tool. The invention further relates to a method of performing double exposure or multiple exposures with varying focus for increasing a process window in a lithographic step. The invention still further relates to performing a double exposure or multiple exposures at varying exposure wavelength.

BACKGROUND

In fabricating integrated circuits multiple patterns are commonly transferred each from a mask or reticle into a resist layer formed on a semiconductor wafer by means of an exposure in an exposure tool. Each of the exposures is usually followed by steps of processing the layer, which may relate to developing the resist, transferring the pattern formed in the resist further into an underlying layer, removing the resist, etc., such that one of a number of levels of the integrated circuit is formed.

With continuously increasing structure densities within patterns the resolution capability of exposure tools has been reached, which happens when structure widths become comparable to the wavelength of a corresponding exposure light beam. Accordingly, resolution enhancement techniques have been developed to push the critical dimensions of structures to even smaller dimensions. These techniques relate, for example, to the use of half-tone or alternating phase shift masks in an exposure, to an application optical proximity correction, when the mask layout is created, etc.

Typical patterns to be transferred from a mask to a semiconductor wafer having small and thus critical structure widths are contact hole patterns. These are used, e.g., to connect different metal layers of the integrated circuit. In the case of dynamic random access memories (DRAMs), contact hole patterns are provided with a highly regular or periodic arrangement of square-like structures, where each hole pattern has a particularly critical width with respect to the resolution limit of a respective exposure tool.

In comparison with lines and spaces patterns, contact hole patterns are less suited for the alternating phase shift mask technique. Consequently, the process window defined by allowed ranges of exposure tool parameters, such as dose and focus (which yield a sufficient dimensional stability or accuracy of the transferred pattern with respect to the original formed on the mask), is considerably reduced. Nevertheless, the same arguments hold true for any other pattern that has structure widths near the practical resolution limit. Further important examples are patterns comprising, e.g., both isolated and periodically arranged structures.

There have also been extensive efforts to improve the exposure tools used to perform an exposure. These efforts had been concentrated on increasing the depth of focus (i.e., the range of focus settings which yield a structure width) which is in sufficient proximity to a specified reference width. One known technique is to vary the focus throughout an exposure or, alternatively, to apply multiple exposures with respect to one pattern transferal from a mask onto a wafer with each exposure representing a different value of the focus set for this exposure. The latter method of varying the z-axis of the wafer stage in an exposure tool to discrete focal planes is called focus latitude enhancement exposure (FLEX). The FLEX method is disclosed in Fukuda et al., "*Improvement of defocus tolerance in a half-micron optical lithography by the focus latitude enhancement exposure method: simulation and experiment*", J. VAC. SCI. TECHNOL. B. 7 (4) July/August 1989, p. 667-674.

The fundamental idea of this method is to overlay the aerial images due to a number of exposures, each of the exposures being applied with a different value for the focus offset of the wafer plane with respect to a focal plane. This overlay is performed in the same resist layer on a wafer, i.e., within the same exposure process comprising a number of exposure steps. The range of focus settings is increased, which yields a specified range of structure widths for the critical structures of the pattern, i.e., the depth of focus (DOF) is improved. Generally, this improvement arrives at the cost of reductions in image contrast, among others. However, the improvement of an increased process window more than completely outweighs that reduction in contrast.

A still further refinement of the method is achieved by applying a tilt in y- or x-direction of the wafer stage during exposure. The wafer is then scanned with an exposure slit while changing the local focus due to a z-movement of the stage. As a result, a through-the-focus exposure during just one exposure or scanning step becomes feasible.

However, there are some disadvantages of both types of multiple focus exposures: In the case of applying an x- or y-tilt to the wafer stage, the dynamic leveling range of the exposure tool wafer stage is limited. Further, a trade-off exists between the focus offset control and the illumination uniformity across the slit, which scans the tilted wafer surface.

The multiple exposure technique according to FLEX suffers from throughput impacts, since the scanning slit needs some time when repeatedly crossing the exposure field and wafer surface. Further, discrete focus adjustments have to be performed, where with each adjustment an additional autofocus error is introducing amounting to +/−25 nm.

In order to circumvent the problems of mechanical focus adjustments of the wafer stage, another approach is proposed which mimics a focus adjustment by means of varying the wavelength of the exposure tool light source which is used to illuminate the mask or reticle for transferring the pattern onto the wafer. The method is also called "resolution enhancement by laser-spectrum adjusted exposure" (RELAX), and is disclosed, e.g., in Lalovic, I. et al., "*Depth of focus enhancement by wavelength modulation: can we RELAX and improve focus latitude?*", (*Proceedings of* 40*th Interface Symposium Conference* 2003, San Diego, Sep. 21-23, 2003), and also in U.S. Patent Application Publication No. US 2002/0048288. In the RELAX method, a linear relationship exists between defocus (focus offset from ideal or best focus) and wavelength such that a modulation of a component of the output spectrum of a laser light source in an exposure tool corresponds to a change in a focus profile. This can be seen from the following relation:

$$DOF = k_2 * \frac{\lambda}{2*(1-\sqrt{1-NA^2})},$$

where the paraxial approximation has been removed. In this equation, DOF refers to the depth of focus, $\lambda$ to the wavelength of the exposure light, NA is the numerical aperture of the lens system, and $k_2$ is determined to +/−0.5.

As a consequence, it is possible to achieve one multifocus exposure by means of, e.g., a dual wavelength beam. For example, an ArF-laser, emitting light at 193 nm, can be tuned to effectively mimic a double exposure at two different focus values, wherein the intensity spectrum comprises essentially two intensity peaks, dislocated from each other by, e.g., 0.5 pm-4.0 pm in wavelength.

However, the dual wavelength approach also suffers from disadvantages. In particular, there is a variation of chromatic magnification across an image field, which might lead to a local image displacement at the borders of the image field. This variation is due to the optical dispersion behavior of the lens system implemented in the exposure tools as well as chromatic aberration of the lenses (higher order aberration terms).

One solution is to compensate chromatic aberration by employing two different materials for the lenses, one having positive and the other negative dispersion function ($dn/d\lambda$). It has been shown that, for lenses in 248 nm exposure tools, this combination of materials is quite effective in reducing chromatic aberration.

SUMMARY

It is an object of the present invention to increase the quality when exposing a semiconductor wafer in an exposure tool. It is further an object of the invention to increase the process window valid for performing an exposure process.

It is a still further object of the invention to increase the throughput of wafers with respect to an exposure in an exposure tool.

It is a still further object of the invention to reduce the influence of chromatic aberration when performing a multiple wavelength exposure of semiconductor wafers.

The aforesaid objects are achieved individually and/or in combination, and it is not intended that the present invention be construed as requiring two or more of the objects to be combined unless expressly required by the claims attached hereto.

In accordance with an embodiment of the present invention, a method for exposing a semiconductor wafer with a pattern from a mask or reticle in an exposure tool, where the exposure tool includes a lens system and a light source, which is arranged to emit an exposure light beam, and that is adjustable to at least two different spectral wavelengths or wavelength ranges, comprises the following steps: providing the semiconductor wafer and the mask to the exposure tool; setting the light source of the exposure tool to emit a first light beam in a first wavelength range; performing a first exposure of the semiconductor wafer with the pattern from the mask through the lens system and via the first light beam; setting the light source of the exposure tool to emit a second light beam in a second wavelength range; adjusting the lens system of the exposure tool to compensate for an amount of image shift of a pattern within a portion of an image field with respect to the first exposure due to chromatic aberration; and performing a second exposure of the semiconductor wafer with the pattern from the mask through the adjusted lens system and via the second light beam.

In accordance with another embodiment of the present invention, an exposure tool comprises a lens system; a light source arranged to emit an exposure light beam, the exposure light beam being adjustable to at least two different spectral wavelength ranges; a calculation unit configured to calculate a dependence between a difference in wavelength of at least two different intensity peaks that correspond to the adjustable light beam and an amount of image shift due to chromatic aberration; a control system connected to the lens system, the light source and the calculation unit, the control system being configured to facilitate an adjustment of a lens of the lens system that depends upon a determined wavelength difference, the control system further being to facilitate tuning of the light source to a wavelength that depends upon an image shift due to chromatic aberration of the lens system.

In accordance with the invention, the process window of an exposure is considerably increased, while an overlay accuracy of the exposure step can be maintained at a high level.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIGS. 1A and 1B depict an embodiment of an exposure tool in first and second exposures in accordance with the present invention.

DETAILED DESCRIPTION OF THE PREFERRED EMBODIMENTS

Figure 2A:
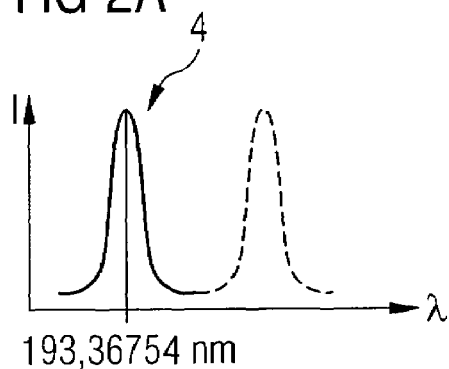
FIGS. 2A and 2B are diagrams of the spectral intensity distribution of the light beams emitted by the light source of the exposure tool of FIG. 1.

In accordance with the invention, a semiconductor wafer is exposed with a pattern from a mask or reticle in an exposure tool, where the exposure tool includes a lens system and a light source. The light source is arranged to emit an exposure light beam, and is further adjustable to at least two different spectral wavelengths or wavelength ranges. The semiconductor wafer and the mask are provided to the exposure tool, and the light source of the exposure tool is set to emit a first light beam in a first wavelength range. A first exposure of the semiconductor wafer is performed with the pattern from the mask through the lens system and via the first light beam. The light source of the exposure tool is then set to emit a second light beam in a second wavelength range, and the lens system of the exposure tool is adjusted to compensate for an amount of image shift of a pattern within a portion of an image field with respect to the first exposure due to chromatic aberration. A second exposure of the semiconductor wafer with the pattern is then performed from the mask through the adjusted lens system and via the second light beam.

An exposure of a semiconductor wafer is performed in a lithographic process using at least two exposure steps. Each exposure of the process (or exposure step) is applied to the mask (or reticle, respectively) and the wafer using a light beam, which for each instance has a different wavelength, or wavelength range. A first exposure of the wafer is performed using a first wavelength, or wavelength range, and a second exposure is performed using a second wavelength, or second wavelength range.

Between both exposures, the lens system is adjusted to compensate for an amount of image shift, that is due to chromatic aberration, and which varies across an exposure field of the semiconductor wafer. The lens system can be adjusted by moving single lenses of the lens system.

A compensation of lens aberrations, which has been mapped using conventional techniques with respect to a lens system, is known and is described in U.S. Patent Application Publication No. 2004/0059444, the disclosure of which is incorporated herein by reference in its entirety. The compensation method is also called "technology for aberration optimization" (TAO). There, a common lens aberration measurement of a projection lens is performed, analyzed in terms of wavefront aberration functions, and then individual lenses of the lens system are moved up or down, or are tilted in x- or y-direction depending upon the results of the analysis in order to compensate for the aberrations, or least reduce their influence.

The light source, or illumination system, of the exposure tool generates a light beam by means of an illumination lens system, which is here considered to be part of the light source. The light beam has a spectral intensity distribution with one or more intensity peaks. For example, the light beam can be generated by a $F_2$, ArF- or KrF-laser system. For exemplary purposes, the corresponding wavelengths are 157 nm, 193 nm, and 248 nm, respectively. However, the method of the invention is not limited to generating light beams at these specific wavelengths. The light beam emitted by the laser light source typically has intensity peaks with an extremely small half width, amounting to, e.g., 0.25-0.50 pm. The half width substantially corresponds to the wavelength range referred to in this document.

The change from the first wavelength (or wavelength range) to the second wavelength (or wavelength range) can be achieved either by tuning the laser to change the wavelength of its (one) intensity peak, or by generating a beam having two intensity peaks and filtering out one of the peaks, e.g., by means of implementing diffraction gratings, etc. within the optical path.

The wavelength difference between both intensity peaks mimics a focus offset. Typical focus offsets to be realized are in the range of 0-500 nm. The corresponding wavelength difference between the peaks is roughly in the range 0-2 pm. However, larger values of the wavelength difference are also considered to fall within the scope of this invention.

Advantageously, each exposure is executed with its dedicated lens setting, which reduces the influence of chromatic aberration and thus considerably reduces the amount of overlay errors particularly at the borders of an image field. Thus, according to the invention, dual or multiple wavelength exposures of a semiconductor wafer become feasible thereby retaining a sufficiently large process window. Further, the wafer does not have to be unloaded from the wafer stage and, moreover, no focus change is necessary between both exposures. As a result, the loss of focus accuracy due to an autofocus error is reduced from, e.g., +/−25 nm for the double exposure to +/−10 nm with respect to the dual wavelength exposure according to the present invention (quantities are provided with respect to a focus offset, or focus equivalent, of 350 nm).

The invention is not limited to a specific type mask, and includes a mask or a reticle. The mask is further suited to transfer patterns in the optical, ultraviolet, deep ultraviolet, extreme ultraviolet wavelength regime, etc, and may also be of the transmission as well as of the reflection type.

The lens system to be adjusted is the projection optical lens system including an object lens. The lens system includes its own housing, wherein large number of lenses, e.g., 20-50 are included, a couple of which maybe adjusted according to the method of the present invention. It is also possible to use a lens system of the immersion type.

The invention is not restricted to performing just two exposures, or exposure steps within one exposure process, for transferring the pattern to the wafer. It is also possible to apply three or even more exposure steps, each at a different wavelength with respect to the projection of the pattern to the wafer.

A dose balance between the first and second exposure can be determined by an optimized overlap of the respective aerial images. It is further possible to apply a weighting to the dose with respect to each of the exposures. Preferably, the first dose deviates from the second dose by a multiplication factor greater than about 1.0 and less than or equal to about 4.0. For example, in a first exposure using a first wavelength, 80 percent of the dose can be exerted on the wafer, while in a second exposure using a second wavelength and having set the lens system accordingly, the rest of 20 percent of the dose can be applied.

According to a further embodiment a laser is tuned in wavelength while performing just one exposure step. In this embodiment, the lens system is adjusted in dependence of the tuning wavelength of the laser. No focus adjustment is necessary. In an advantageous embodiment, a control unit is connected to a calculation unit, which relates a lens setting table to a laser wavelength tuning table, and is connected to the lens system and to the light source control. According to this embodiment, a coordinated tuning and lens adjustment are performed without interrupting the continuous exposure. In a further refinement, the exposure dose can also be adjusted to the tuning wavelength.

The method step of adjusting the lens system is not considered to lead to a substantial adjustment of the focus by itself, as this has to be achieved by the adjustment or change of the wavelength of the light beam.

A further combination of this invention with a conventional focus variation method such as FLEX or wafer tilt as described above is also considered to fall within the scope of this invention.

An exemplary embodiment of an exposure tool of the present invention is depicted in FIGS. 1A and 1B. The exposure tool can be a wafer scanning apparatus or a step and repeat apparatus. An exposure tool 1, which is a scanner, includes a light source 2, or illumination system, including an illumination lens system, and further a projection lens system 10. A mask or reticle 6, upon which a pattern 8 to be transferred is formed, is provided to the exposure tool 1 as well as semiconductor wafer 12, which is deposited upon a stage 14 movable in z-direction, where the z-direction is parallel to the optical axis of the projection lens system.

Figure 3:
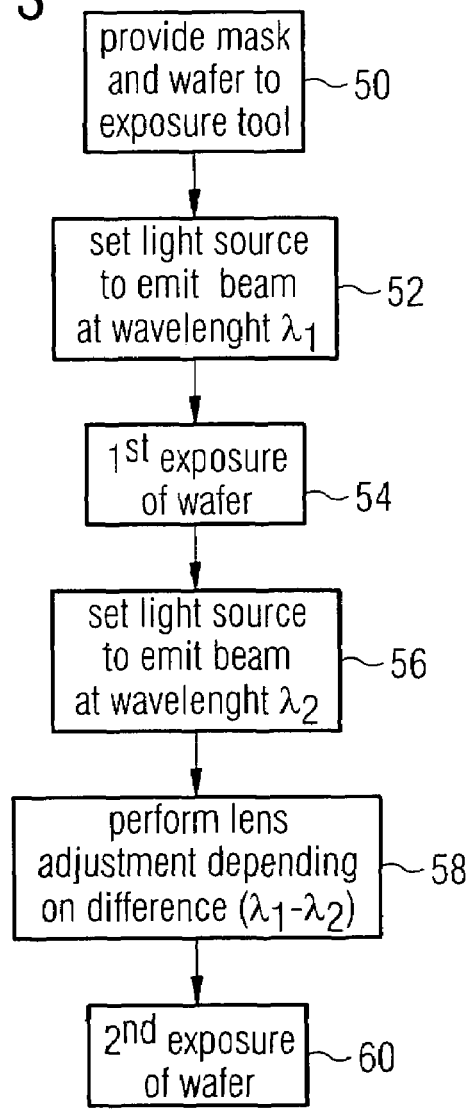
FIG. 3 is a flow chart illustrating exemplary method steps for operating the exposure tool of FIG. 1.

FIG. 3 shows a flow chart illustrating the sequence of method steps for utilizing the exposure tool depicted in FIGS. 1A and 1B in accordance with the present invention. In step 50, the mask or reticle 6 and the semiconductor wafer 12 are provided to the exposure tool 1. The mask or reticle 6 is held by a reticle stage (not shown), and is represented by a halftone phase shift mask with 6% transmission of light. The pattern 8 formed on this mask or reticle 6 relates to a contact hole pattern, which represents a contact layer of a DRAM node. The structure widths of the contact holes to be formed on the wafer 12 amount to 65 nm.

The light source 2, including the illumination lens system and which includes an ArF-laser source, is arranged to generate and emit a light beam having a wavelength of λ=193 nm towards the mask or reticle 6. The illumination is circular with s=0.5.

The projection lens system 10 includes an AT 1200 or AT 1250 lens set manufactured for ASML by Zeiss AG (Oberkochen, Germany). The numerical aperture used here is NA=0.85. The lens setting corresponds to an overall magnification of ¼ (mask to wafer).

A two-step dual wavelength exposure is to be performed in order to transfer the pattern 8 from the mask 6 to the wafer 12. Both exposures are performed to keep 50% of the total dose needed for the exposure. A focus offset of 350 nm is mimicked by using the two different wavelengths. Accordingly, a wavelength difference of 0.91 pm, or $\lambda=\lambda_0+/-0.458$ pm, where $\lambda_0$ is a central wavelength, is realized by means of tuning the wavelength of the ArF-laser source.

Figure 2B:
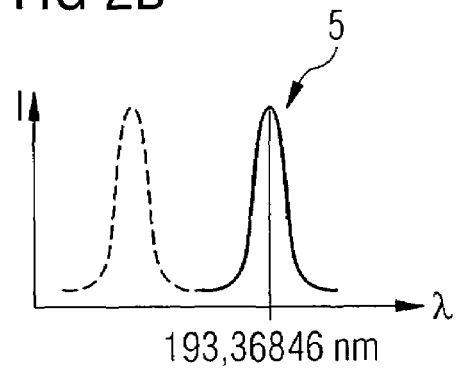

FIGS. 2A and 2B show the spectral intensity distribution of the light beam emitted by the tuned ArF-laser source. The distribution shows two intensity peaks separated by 0.91 pm and having a halfwidth of about 0.25 pm. For the purpose of a first exposure step, a wavelength of λ=193.36754 m is selected. Step 52 includes setting the light source 2 to emit a light beam 4 having the selected wavelength. Step 52 according to this embodiment further includes filtering out portions of the light beam, which refer to the second intensity peak (dotted curve in FIG. 2A).

Using a calculation unit, that is part of control unit 20, which is connected with the tuned light source to obtain the wavelength being selected, an image field magnification at an image field border is determined to be 3.99999951 (i.e., 4.0–0.493 ppm), which is due to the wavelength shift of the light beam. This value depends on the amount of chromatic aberration inherent within the lens system as well as on the dispersion characteristic of the lens material. The control unit further has access to an aberration map for the current lens system according to this embodiment in order to forward this information to the calculation unit, or the calculation unit has direct access. The aberration map used for the calculation may be, e.g., stored in a database.

The resulting image shift at a slit edge can thus be determined. In the present case, it amounts to merely 6 nm, but deviations in overlay up to more than 20 nm are possible, which cannot be accepted for 193 nm lens systems.

In response to the wavelength set for the light source, the control unit 20 thus generates a signal to move single lenses 100 such that this image shift is compensated. Therein, the lens movements do not serve to change the focus, but to adapt the image characteristics to the wavelength dependent chromatic aberration (chromatic magnification). A tool similar to TAO (as described above) can be employed to perform the task of these lens movements. However, a supplement of such a tool is necessary to incorporate a wavelength dependence of aberration due to a tunable laser.

The next step 54 includes the actual exposure, which is depicted in FIG. 1A. The focal plane 16 of the projection lens system 10 is offset from the surface of the wafer 12 by +175 nm due to the changed wavelength, while the image is widened by 6 nm due to the movements of single lenses 100 in order to perform the lens adjustment in step 52.

In step 56, the light source is again set to emit a light beam 5 at another wavelength (as depicted in FIG. 2B), where the second intensity peak at λ=193.36846 nm is selected, and the other intensity peak is filtered out, e.g., by a diffraction grating (shown as the dotted curve in FIG. 2B).

The border of the image field is determined to receive a magnification of 4.00000049 (i.e., 4.0+0.493 ppm) in a forthcoming exposure. Again, the control unit 20, which is connected to both the light source 2 and the lens system 10 (including drives moving the lenses 100), directs the calculation unit to evaluate a new lens setting from the aberration characteristics and then performs the adjustment of the lens system (step 58).

During these steps 56-60, no z-movement of the wafer stage is performed, which is indicated by the horizontal dash-dotted line in FIGS. 1A and 1B. Step 60 refers to the second exposure (shown in FIG. 1B), which is performed using the varied wavelength (step 54) and the changed lens setting (step 56). As a result of the second exposure the focal plane 17 is shifted to the opposite (bottom) side of the surface of the wafer 12, deviating from the surface by −175 nm. The magnification larger than 4.0 is corrected due to the lens setting yielding a decrease of the image width by −6 nm.

It is noted that the lens setting does not necessarily involve a linear increase of the image. Rather, it depends on the aberration map characteristics specific for the currently used lens system 10, which are generally explicitly non-linear.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE NUMERALS 1 exposure tool
2 light source with illumination lenses
4 light beam (first wavelength/exposure)
5 light beam (second wavelength/exposure)
6 mask or reticle
8 pattern
10 projection lens system
12 semiconductor wafer
14 wafer stage
16 focal plane (first exposure)
17 focal plane (second exposure)
20 control unit (including calculation unit)
50-60 process steps
100 single movable lenses

What is claimed is:

1. A method for exposing a semiconductor wafer with a pattern from a mask in an exposure tool, the exposure tool including a lens system and a light source configured to emit an exposure light beam that is adjustable to at least two different spectral wavelengths, the method comprising:

providing the semiconductor wafer and the mask to the exposure tool;

setting the light source of the exposure tool to emit a first light beam at a first wavelength;

performing a first exposure of the semiconductor wafer with the pattern from the mask through the lens system and via the first light beam;

setting the light source of the exposure tool to emit a second light beam at a second wavelength;

adjusting the lens system of the exposure tool to compensate for an amount of image shift of a pattern within a portion of an image field with respect to the first exposure due to chromatic aberration; and performing a second exposure of the semiconductor wafer with the pattern from the mask through the adjusted lens system and via the second light beam.

2. The method of claim 1, wherein the semiconductor wafer and the mask are provided to an exposure tool which is one of a wafer scanning apparatus or a step and repeat apparatus.

3. The method of claim 1, wherein the semiconductor wafer and the mask are provided to an exposure tool which has a light source that emits light at wavelengths of at least one of 157 nm, 193 nm, 248 nm, and 365 nm.

4. The method of claim 1, wherein the semiconductor wafer and the mask are provided to an exposure tool that includes a light source configured to emit light with a spectral intensity distribution comprising at least two intensity peaks coincidently, and each intensity peak has a wavelength range of less than 5 pm.

5. The method of claim 4, wherein each step of setting the light source of the exposure tool to emit the light beam at the first wavelength and the light beam at the second wavelength includes filtering out an intensity peak at a corresponding wavelength that is not selected for each of the first light beam and the second light beam.

6. The method of claim 5, wherein the filtering is achieved utilizing a diffraction grating.

7. The method of claim 1, further comprising:
presetting for each of the first and second exposures a factor of magnification that corresponds with a magnification of the pattern from the mask being transferred onto the semiconductor wafer;
independently calculating for each of the first and the second exposures and for at least one portion of an image field on the semiconductor wafer an exposure specific value of magnification that accounts for chromatic aberration; and
adjusting the lens system based upon the difference between each of the first and second exposure specific values of magnification and the corresponding preset value of magnification for each of the first and second exposures.

8. The method of claim 7, further comprising:
obtaining a difference between at least one of the first and second wavelengths and the center wavelengths of intensity peaks of the first and second exposure light beams emitted by the light source; and
calculating exposure specific values of magnification based upon the obtained difference.

9. The method of claim 7, further comprising:
determining an amount of shift of a pattern due to chromatic aberration in the portion of an image field on the semiconductor wafer.

10. The method of claim 9, further comprising:
calculating the exposure specific value of magnification from the image shift of the pattern within the portion of an image field.

11. The method of claim 1, further comprising:
obtaining a difference between at least one of the first and second wavelengths and the center wavelengths of intensity peaks of the first and second exposure light beams emitted by the light source; and
adjusting the lens system based upon the obtained difference.

12. The method of claim 1, wherein the light source is a laser, and setting the light source of the exposure tool to emit each of the light beams at the first wavelength and the second wavelength includes tuning a wavelength of the laser.

13. The method of claim 12, wherein the wavelengths of each of the light beams emitted by the laser is tuned based upon an amount of image shift caused by chromatic aberration, and wherein chromatic aberration is determined from at least one portion of an image field on the surface of the semiconductor wafer.

14. The method of claim 1, wherein the pattern to be transferred from the mask to the semiconductor wafer is a contact hole pattern.

15. The method of claim 1, wherein the first exposure is performed by applying a first dose to the first light beam and the second exposure is performed by applying a second dose to the second light beam, and the first dose deviates from the second dose by a multiplication factor greater than about 1.0 and less than or equal to about 4.0.

16. A method for exposing a semiconductor wafer with a pattern from a mask in an exposure tool, the exposure tool including a lens system and a laser light source configured to emit an exposure light beam that is adjustable with respect to its spectral wavelength, the method comprising:
providing the semiconductor wafer and the mask to the exposure tool;
setting the light source of the exposure tool to emit an exposure light beam starting with an initial spectral wavelength;
performing an exposure of the semiconductor wafer with the pattern from the mask through the lens system and via the light beam;
while performing the exposure, tuning the laser light source so as to vary the spectral wavelength of the emitted exposure light beam; and
coincidently adjusting the lens system of the exposure tool, based upon the varied wavelength of the tuned laser light source, so as to compensate for an amount of image shift of a pattern within a portion of an image field due to chromatic aberration.

17. The method of claim 16, wherein the semiconductor wafer and the mask are provided to an exposure tool which is one of a wafer scanning apparatus and a step and repeat apparatus.

18. The method of claim 16, wherein the semiconductor wafer and the mask are provided to an exposure tool that includes a laser light source that emits light at wavelengths of at least one of 157 nm, 193 nm, 248 nm, and 365 nm.

19. The method of claim 16, wherein the semiconductor wafer and the mask are provided to an exposure tool that includes a laser light source arranged to emit an exposure beam with a spectral intensity distribution comprising intensity peaks, and each intensity peak has a wavelength range of less than 5 pm.

20. An exposure tool, comprising:
a lens system;
a light source configured to emit an exposure light beam that is adjustable to at least two different spectral wavelength ranges;
a calculation unit configured to calculate a dependence between a difference in wavelengths of at least two different intensity peaks, the different intensity peaks corresponding to the adjustable light beam and an amount of image shift due to chromatic aberration; and
a control system connected to the lens system, the light source and the calculation unit, where the control system is configured to:
perform a lens adjustment in dependence of a calculated wavelength difference; and
facilitate tuning of a wavelength based upon an image shift due to chromatic aberration of the lens system.

* * * * *